United States Patent [19]

Tokura et al.

[11] Patent Number: 5,504,360
[45] Date of Patent: Apr. 2, 1996

[54] VERTICAL TYPE SEMICONDUCTOR DEVICE PROVIDED WITH AN IMPROVED CONSTRUCTION TO GREATLY DECREASE DEVICE ON-RESISTANCE WITHOUT IMPAIRING BREAKDOWN

[75] Inventors: Norihito Tokura, Okazaki; Kunihiko Hara, Nukata, both of Japan

[73] Assignee: Nippondenso Co., Ltd., Kariya, Japan

[21] Appl. No.: 293,421

[22] Filed: Aug. 22, 1994

Related U.S. Application Data

[63] Continuation of Ser. No. 764,325, Sep. 24, 1991, abandoned.

[30] Foreign Application Priority Data

Sep. 24, 1990 [JP] Japan ................. 2-254960
Aug. 22, 1991 [JP] Japan ................. 3-211125

[51] Int. Cl.⁶ .................. H01L 29/76; H01L 29/94; H01L 31/062
[52] U.S. Cl. .................. 257/342; 257/328; 257/329; 257/335; 257/339; 257/341
[58] Field of Search .................. 357/55; 257/328, 257/329, 335, 339, 341, 342

[56] References Cited

U.S. PATENT DOCUMENTS

| 4,366,495 | 12/1982 | Goodman et al. | |
|---|---|---|---|
| 4,743,952 | 5/1988 | Baliga | 357/23.4 |
| 4,893,160 | 1/1990 | Blanchard | |
| 5,034,785 | 7/1991 | Blanchard | |

FOREIGN PATENT DOCUMENTS

| 0335750 | 10/1989 | European Pat. Off. | 357/23.4 |
|---|---|---|---|
| 0118976 | 10/1984 | Japan . | |
| 0188976 | 10/1984 | Japan | 357/23.4 |
| 0219965 | 12/1984 | Japan | 357/23.4 |
| 60-107866 | 6/1985 | Japan . | |
| 0064165 | 4/1986 | Japan . | |
| 0084165 | 4/1986 | Japan | 357/23.4 |
| 2298152 | 12/1987 | Japan . | |
| 0254769 | 10/1988 | Japan . | |
| 63-254769 | 10/1988 | Japan . | |
| 3266882 | 11/1988 | Japan . | |
| 2154468 | 6/1990 | Japan . | |
| 2231771 | 9/1990 | Japan . | |
| 2127222 | 9/1982 | United Kingdom . | |

OTHER PUBLICATIONS

Yoshida et al, Japanese J of Applied Physics. Supp., vol. 15, No. 7, "A High Power MOS-FET with a Vertical Drain Electrode and Meshed Gate Structure" pp. 179–183.

Primary Examiner—Robert P. Limanek
Assistant Examiner—Valencia Martin Wallace
Attorney, Agent, or Firm—Cushman, Darby & Cushman

[57] ABSTRACT

A vertical type semiconductor device is provided with an improved construction which greatly decreases the on-resistance without impairing the breakdown voltage thereof. In the fundamental DMOS cells that control a current to constitute the vertical semiconductor device, through-hole cells are arranged along the sides of a cell having a channel. The through-hole cell includes a through-hole extending from the surface of an $n^-$-type drift region toward an $n^+$-type drain region, and also includes an $n^+$-type through-hole region that is formed by diffusing impurities from the inner wall of the through-hole which is continuous with the $n^+$-type drain region. A breakdown voltage of the element is maintained by the $n^-$-type drift region between a p-type well region and the $n^+$-type through-hole region or the $n^+$-type drain region. Given the unique arrangement of the through-hole cells, the JFET resistance component becomes negligibly small between the DMOS cells neighboring along the sides of the cells despite the fact that the cells are finely formed, and a small on-resistance is exhibited.

25 Claims, 5 Drawing Sheets

VERTICAL TYPE SEMICONDUCTOR DEVICE PROVIDED WITH AN IMPROVED CONSTRUCTION TO GREATLY DECREASE DEVICE ON-RESISTANCE WITHOUT IMPAIRING BREAKDOWN

This is a continuation of application Ser. No. 07/764,325, filed on Sep. 24, 1991, which was abandoned upon the filing hereof.

BACKGROUND OF THE INVENTION

1. Field of the Invention

The present invention relates to a vertical type semiconductor device, such as a vertical type power MOSFET, particularly one which has decreased on-resistance.

2. Description of the Related Art

The conventional vertical type power MOSFETs have in many cases been constructed as shown in FIG. 3 (e.g., see Japanese Unexamined Patent Publication (Kokai) No. 63-254769). When the channel conduction type is of the n type in this structure, a p-type well 13 is formed on the surface of a semiconductor substrate 11 in which the elements will be formed, and n-type source regions 14 of a high concentration are formed in the well 13. An $n^+$-type drain region 12 of high concentration is formed at a maintained predetermined depth depending upon the breakdown voltage of the elements. The portion 11 sandwiched between the well 13 and the $n^+$-type drain region 12 is called an n-type drift region and has a relatively low concentration.

The breakdown voltage between the drain and source of this element is determined by the thickness of the drift region 11 and thus the impurity concentration, and a thickness and a concentration are selected to satisfy the desired breakdown voltage. When a voltage is applied to a gate 17 disposed over the well 13, an n-type inverted layer is formed on the surface of the semiconductor substrate in the well 13, and an electric current flows between the source and the drain.

In a practical vertical type MOSFET, a portion (cell) denoted by A in FIG. 3 is repetitively arranged to constitute the vertical type MOSFETs. The size a of the portion A is selected to be as small as possible allowed under the manufacturing process or under the element characteristics. This makes it possible to maximize the number of current paths included per unit area.

One of the important characteristics of the vertical power MOSFET is a product (referred to as $R_{ONS}$) of element area and on-resistance. If compared on the basis of a predetermined element area, the voltage drop across the source and drain when a current is permitted to flow decreases with a decrease in the value of product, and a reduced amount of electric power is the consumed by the element. The product $R_{ONS}$ can be decreased by either decreasing the resistance of the element itself or decreasing the element area.

Hatched portions in FIG. 4 represent current paths in the drift region. If viewed in the direction of depth from the surface of the substrate, it will be recognized that a region sandwiched by the wells 13 forms a bottleneck that broadens toward the drain 12. The bottleneck is formed by the effect of a junction-type field-effect transistor (referred to as a JFET) parasitically formed in the semiconductor substrate in the vertical direction. That is, a potential difference develops along the current path due to a resistance component in the drift region, the junction between the well and the drift region is inversely biased by a potential difference between the drift region 11 and the source 14 and well 13 secured to a ground potential, and a depletion layer expands toward the drift region having a relatively low impurity concentration to narrow the current path.

The effect of the JFET is conspicuous with an increase in the voltage applied to the drain or with an increase in the drain current. The resistance of a region upon which the effect of the JFET will act is denoted by $R_{JFET}$. The on-resistance $R_{CELL}$ between the source terminal S and the drain terminal D of a vertical type MOSFET cell can be represented by a resistance $R_S$ of the source region, a channel resistance $R_{CH}$, a resistance $R_{DRI}$ of the drift region, and a resistance $R_{DRA}$ of the drain region, in addition to the resistance of the region upon which the effect of the JFET will act $R_{JFET}$, i.e., $$R_{CELL}=R_S+R_{CH}+R_{JFET}+R_{DRI}+R_{DRA} \quad (1).$$

Furthermore, a relation between $R_{CELL}$ and $R_{ONS}$ can obviously be given as follows:

$$R_{ONS}=R_{CELL}/N \quad (2)$$

where N denotes a number of cells per unit area.

Referring to FIG. 4, a distance s between the neighboring gates provides a space for making contact with the wiring and for a $p^+$-type region 15 that provides potential to the source 14 and well 13. The distance s varies depending upon the precision of processing the formed elements, can be determined if the manufacturing apparatus and, process are specified, and cannot be smaller than a predetermined value.

FIG. 5 shows a relationship between the well distance l and the product $R_{ONS}$ of element area and on-resistance. As the distance l decreases, the bottleneck of the current path shown in FIG. 3 becomes narrow and $R_{JFET}$ increases, whereby $R_{CELL}$ increases more than N, and $R_{ONS}$ increases. If the distance l is increased, on the other hand, the effect of JFET is weakened but the area increases unnecessarily and $R_{ONS}$ also increases. As a result, therefore, if the breakdown voltage and the precision of the machining process are determined, there is an optimum distance l at which point the product $R_{ONS}$ is the smallest as shown in FIG. 5.

In order to further decrease the minimum value of $R_{ONS}$ shown in FIG. 5, Japanese Unexamined Patent Publication (Kokai) No. 63-254769 proposes a structure that is shown in FIG. 6. According to this structure, a groove 20 is formed in a region sandwiched by the wells 13, and a layer 21 of a high impurity concentration is formed around the groove in order to decrease the resistance of this portion. Therefore, even if the depletion layer expands from the boundary of the well and drift region toward the drift region, the high-impurity-concentration layer 21 around the groove is not depleted. Accordingly, a low resistance is maintained and a low value for $R_{JFET}$ is maintained.

$$R_{CELL}=R_S+R_{CH}+R_{DRI}+R_{DRA} \quad (3).$$

As described above, the structure of FIG. 6 makes it possible to suppress an increase in the on-resistance due to the JFET effect. This eventually makes it possible to shorten the distance l between the wells; i.e., $R_{CELL}$ is decreased without changing the number N of cells and $R_{ONS}$ is also decreased, as compared with that of the structure of FIG. 3.

The prior art shown in FIG. 6 can be expected to decrease $R_{ONS}$ more than the prior art shown in FIG. 3. Owing to the progress in machining technology in recent years, however, the distance l between the wells shown in FIG. 4 has now been shortened to several microns for the vertical type low-voltage-breakdown MOSFETs, which have a breakdown voltage of several tens of volts, and the size a of the portion A of FIG. 3 has been reduced to smaller than 20 μm (e.g., Nikkei Electronics, Nikkei BP Co., Jun. 4, 1990, p. 142). Even if the groove 20 is simply formed in the region sandwiched by the wells 13 as shown in FIG. 6, the distance l between the wells must be increased to provide a gap so that the wells 13 will not come in contact with the groove 20. Therefore, the area increases undesirably, and N decreases more than $R_{CELL}$ decreases as is obvious from the relation (2), and $R_{ONS}$ increases.

According to the conventional technology shown in FIG. 6, which is effective for decreasing the resistance $R_{JFET}$ of the bottleneck portion only, the value $R_{ONS}$ decreases little since the resistance $R_{DRI}$ of the drift region and the similar resistance of like regions are not decreased. That is, even if high grade machining technology is adapted to the structures of the prior art of FIGS. 3 and 6, it is not possible to decrease the product $R_{ONS}$ without impairing the breakdown voltage of the element.

Moreover, when the element of the structure shown in FIG. 6 is in a turned-off condition, a high voltage applied to the drain electrode is induced in the channel portion via the drift region 11 and there is an impurity layer 21 of high concentration around the groove, giving rise to the occurrence of breakdown that makes it difficult to obtain a necessary breakdown voltage and, further, causes the gate oxide film 16 to be destroyed.

SUMMARY OF THE INVENTION

The object of the present invention is to provide a vertical low-breakdown-voltage type semiconductor device having a breakdown voltage of several tens of volts and having a structure capable of greatly decreasing the resistance $R_{ONS}$ without impairing the breakdown voltage of the element.

In order to accomplish the above object, the vertical type semiconductor device according to the present invention basically has the technical constitution as described below.

That is, the present invention provides a vertical type semiconductor device comprising
a first semiconductor layer constituted by a semiconductor layer of a first type of conduction that forms a drain region.

A second semiconductor layer of the first type of conduction is formed on the main surface of the first semiconductor layer and has an impurity concentration lower than the impurity concentration of the drain region.

Well regions constituted by a plurality of isolated semiconductors of a second type of conduction that are formed from the main surface of the second semi-conductor layer inward of the second semiconductor layer.

Source regions constituted by a plurality of semiconductors of the first type of conduction are formed in the well regions, and a gate electrode provided adjacent to a junction portion between the well region and the source region in order to form a channel region at the junction portion.

The vertical type semiconductor device further has at least one hole portion formed in a region other than the regions where the plurality of well regions are formed in the second semiconductor layer. The hole portion extends from the main surface of the second semiconductor layer up to the first semiconductor layer.

The present invention also provides a vertical type semiconductor device comprising.
a drain region of a first type of conduction.

A semiconductor layer of the first type of conduction formed on one main surface of the drain region and has an impurity concentration lower than that of the drain region to serve as a drift region.

A current control cell region that controls the current between the drain and the source is comprised of a well region of a second type of conduction that is connected to one region of the semiconductor layer buried in the surface of the semiconductor layer, and has a PN junction relative to the semiconductor layer. The PN junction terminates in the surface of the semiconductor layer. A source region of the first type of conduction has a PN junction relative to the well region, the PN junction terminating in the surface of the well region. An insulated gate structure constituted on a channel region consists of the surface of the well region between the drift region and the source region.

A low-resistance cell region has a low-resistance region of the first type of conduction that is set in another region of the semiconductor layer to correspond to the channel region of the current control cell region, extends from the surface of the semiconductor layer up to the drain region, and has an impurity concentration higher than that of the semiconductor layer that forms the drift region via the drift region.

According to a further embodiment of the present invention, a vertical semiconductor device is provided wherein a semiconductor substrate of a first type of conduction consists of a layer of a high impurity concentration and a layer of a low impurity concentration; the layer of the high impurity concentration serves as a drain region. The surface of the layer of the low impurity concentration forms a main surface. A well region of a second type of conduction is formed in a portion of the main surface. A source region of the first type of conduction is formed in a portion of the surface of the well region. A gate electrode is formed on a periphery of the well region of the second type of condition via an insulating film in order to form a channel region on the periphery of the well region. The layer of the low impurity concentration forms a drift region between the well region of the second type of conduction and the drain region, and a current between the drain and the source is controlled by applying a voltage to the gate electrode. A hole is formed extending from the main surface between the neighboring well regions up to the drain region passing through the layer of the low impurity concentration (drift region), and the electric resistance in the lengthwise direction of the hole is set to be smaller than the electric resistance of the layer of the low impurity concentration inside or around the hole.

Furthermore, the region between the channel and the holes is formed in a recessed structure and a pattern is employed in which the well regions and the holes are alternatingly arranged in the vertical and lateral directions.

According to the present invention, $R_{JFET}$ and $R_{DRI}$, which are on-resistance components of the vertical semiconductor device, decrease drastically due to a low-resistance region near the hole formed between the well regions, and the resistance decreases in these regions.

Moreover, since the region between the channel and the hole is formed in the recessed structure, the concentration of electric field under the off condition is reduced enabling the breakdown voltage to increase and, at the same time, resistance of the portion of the recessed structure decreases under the on condition.

Owing to the pattern in which the well regions and the holes are alternatingly arranged, furthermore, the distance is maintained between the channel and the hole while the pattern is finely formed, and a necessary breakdown voltage is maintained because of this distance.

It is therefore possible to realize a vertical low-breakdown-voltage type semiconductor device having a breakdown voltage of several tens of volts that greatly decreases the $R_{ONS}$.

DESCRIPTION OF THE PREFERRED EMBODIMENTS

In the vertical semiconductor device according to the present invention, no particular limitation is imposed on the type of transistor; i.e., it may be a field-effect transistor or a bipolar transistor. In particular, the field-effect transistor may have a MOS structure.

Figure 1:
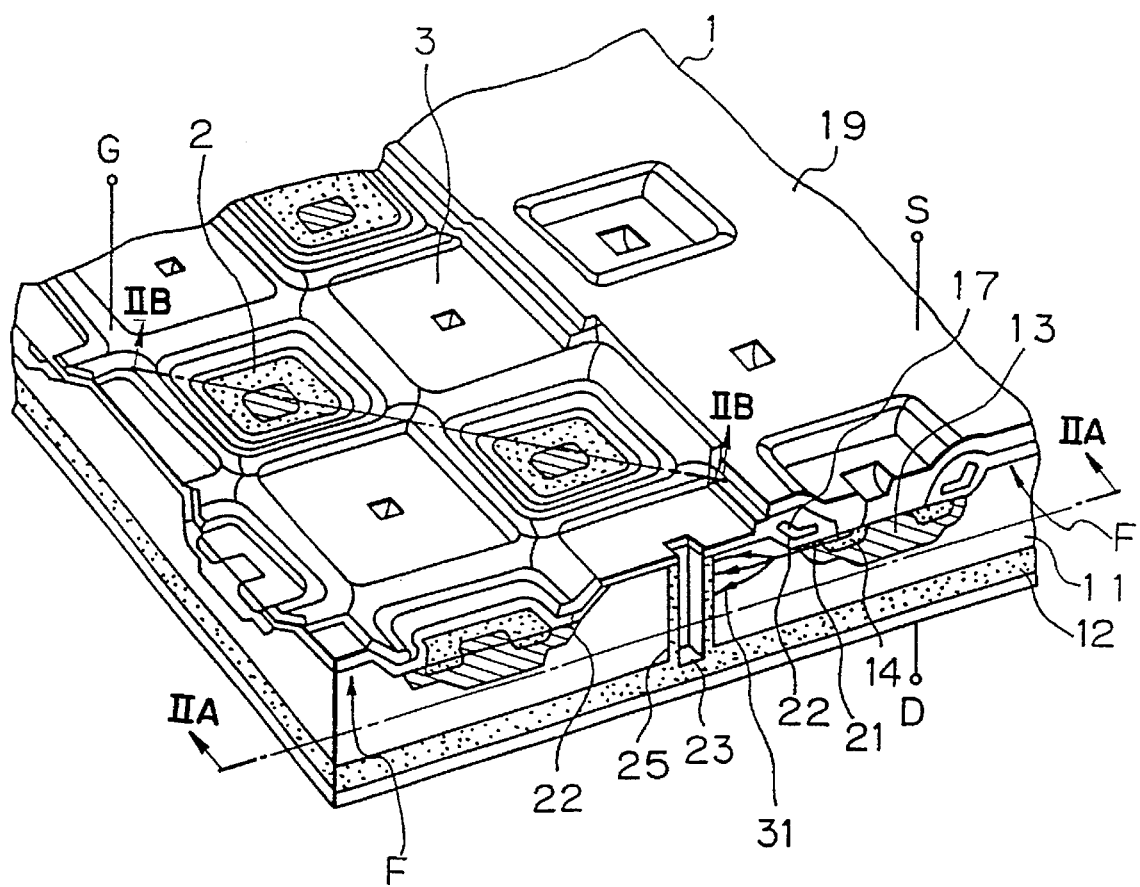
FIG. 1 is a diagram which schematically illustrates the three-dimensional structure of a vertical type MOSFET according to an embodiment of the present invention.
Figure 2A:
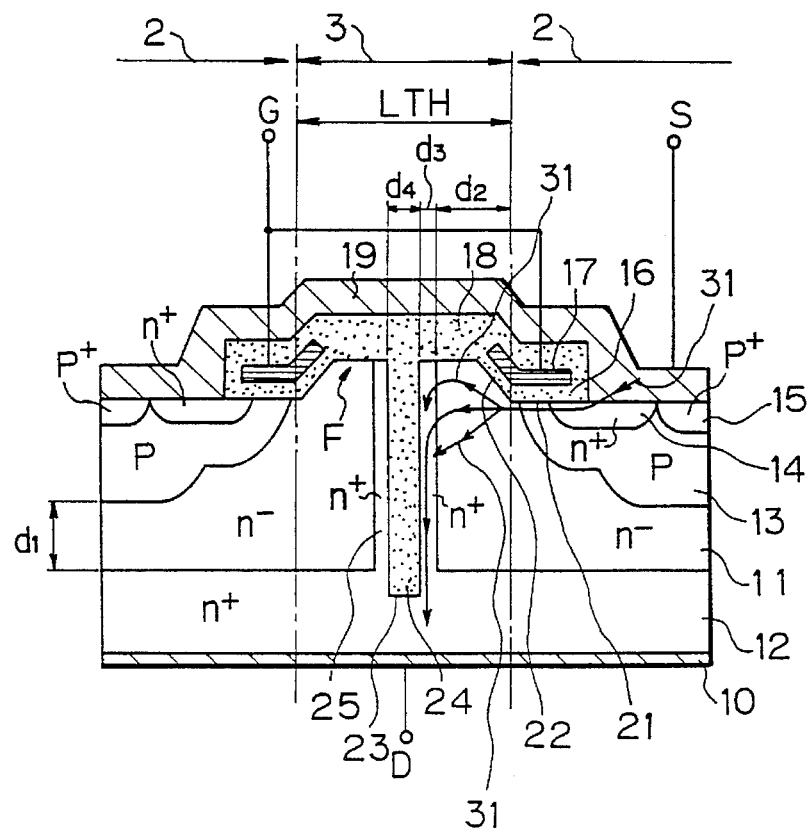
FIG. 2(a) is a section view along the line A—A' in FIG. 1.
Figure 2B:
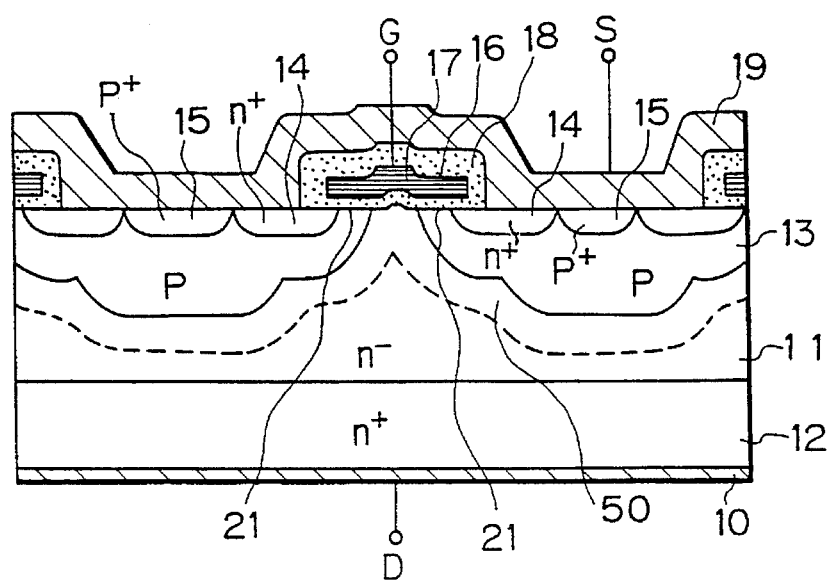
FIG. 2(b) is a section view along the line B—B' in FIG. 1.

The invention will now be described in detail with reference to embodiments shown in the drawings. FIGS. 1, 2(a) and 2(b) are diagrams of an embodiment in which the present invention is adapted to an n-channel vertical type MOSFET, and wherein FIG. 1 is a diagram that schematically illustrates the three-dimensional structure, FIG. 2(a) is a section view along the line A—A' in FIGS. 1 and 2(b) is a section view along the line B—B' in FIG. 1.

Figure 3:
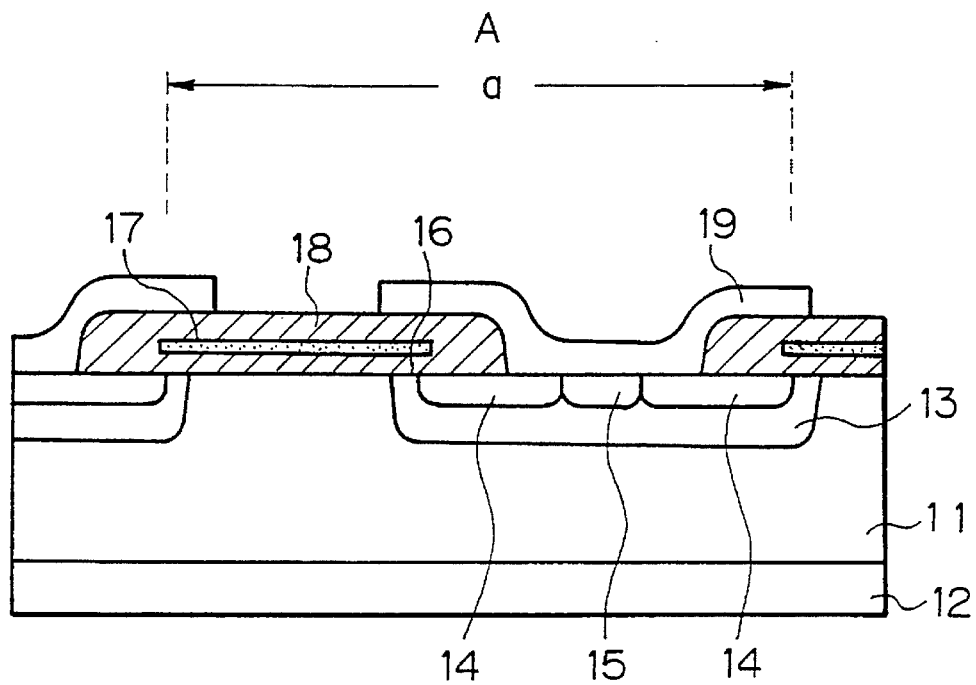
FIG. 3 is a section view illustrating the basic structure of the conventional vertical type MOSFET.
Figure 4:
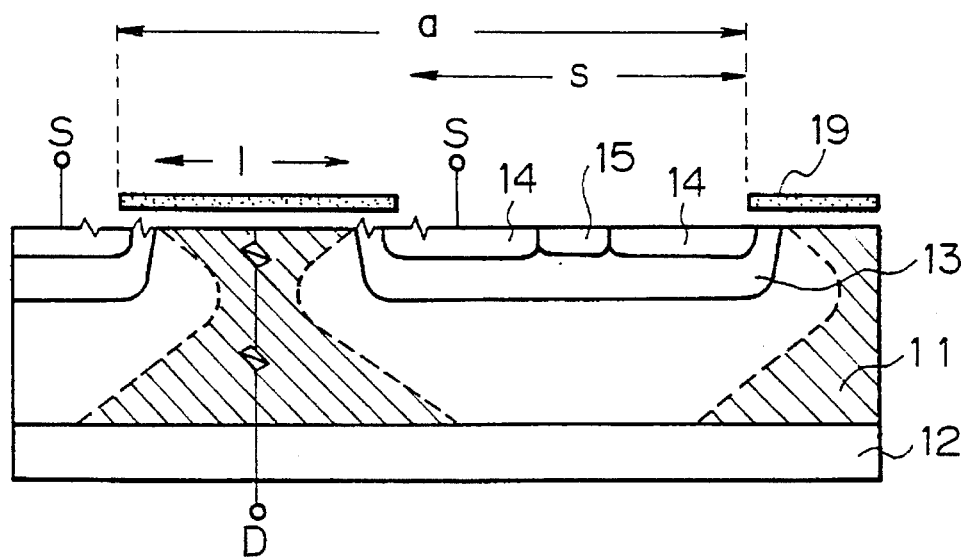
FIG. 4 is a diagram showing a current path and a resistance component of the conventional vertical type MOSFET.

The vertical type MOSFET 1 of the present invention shown in FIG. 1 consists of DMOS (double diffused MOS) cells 2 and through hole cells 3 alternatingly arranged in the vertical and lateral directions. In the DMOS cell 2 shown in FIGS. 1, 2(a) and 2(b), the constituent portions common to those of FIG. 3 are denoted by the same reference numerals. Next, described below is the constitution of the vertical type MOSFET 1 of the present invention and the rough method of fabricating the same.

A semiconductor substrate consists of a layer of a high impurity concentration that serves as an $n^+$-type drain region 12 (i.e., a first semiconductor layer 12 having a first type of conduction) and a layer 11 of a low impurity concentration, i.e., a second semiconductor layer 11 having the first type of conduction part of which forms an $n^-$-type drift region. The surface of the $n^-$-type layer 11 having the low impurity concentration serves as a main surface F. On this main surface is formed a step by the LOCOS α (local oxidation of silicon) method that effects the selective oxidation using a patterned silicon nitride film that is not shown as a mask or by the anisotropic etching method using a patterned resist film. A recessed structure is formed on the main surface wherein the surface of the through hole is higher by 1 to 1.5 μm than the surface of the DMOS cell, and an $n^-$-type recessed region 22 is formed. Next, a gate oxide film 16 is formed maintaining a thickness of about 50 nm, and a polysilicon film is formed thereon maintaining a thickness of about 400 nm by the CVD method. The polysilicon film is patterned into a predetermined shape to form a gate electrode 17.

Using the gate electrode 17 as a mask, a p-type well region 13 (i.e., a well region consisting of a semiconductor of a second type of conduction) is formed by diffusion from the main surface. An $n^-$-type drift region 11 sandwiched between the p-type well region 13 and an $n^+$-type drain region 12 must have a thickness $d_1$ and an impurity concentration $n_1$ that satisfy a desired breakdown voltage. Then, an $n^+$-type source region (i.e., a source region consisting of a semiconductor of a first type of conduction) 14 is formed by diffusion from the main surface using the gate electrode 17 and a resist that is not shown as masks. A channel 21 is formed in a portion where the p-type well region 13 comes into contact with the main surface F by double diffusion of the p-type well region 13 and the $n^+$-type source region 14. When a voltage in excess of a threshold voltage is applied to the gate electrode 17, an inverted layer is formed in the channel 21 due to the effect of an electric field, and the $n^+$-type source region 14 and the $n^-$-type recessed region 22 become electrically conductive to each other via the channel 21. Further, a $p^+$-type well contact region 15 is formed by diffusion at the center in the main surface of the p-type well region 13. The gate electrode serves as part of the elements that constitute the current control cell region of the present invention.

Next, a thin and elongated hole 23 is formed vertically from the center in the main surface of the through hole cell 3 up to the $n^+$-type drain region 12 penetrating through the $n^-$-type drift region 11 by anisotropic dry etching using a resist that is not shown as a mask. An $n^+$-type through hole region 25 is formed by vapor phase diffusion from inside the hole 23. Then, the inside of the hole 23 is filled with an insulating material 24 to form an interlayer insulating film 18. The $n^+$-type through hole region 25 makes the $n^-$-type recessed region 22 and the $n^+$-type drain region 12 electrically conductive to each other and maintains a small resistance. Here, the $n^-$-type recessed region 22 must have a length $d_2$ and an impurity concentration $n_2$ that help obtain a desired breakdown voltage. Owing to the pattern in which the DMOS cells 2 and the through hole cells 3 are alternatingly arranged in the vertical and lateral directions, the $n^-$-type recessed region 22 maintaining a sufficient length $d_2$ is formed.

That is, the above-mentioned hole portion forms a low-resistance region of the vertical type that exhibits actions and effects of the present invention.

The interlayer insulating film 18 is patterned using a resist mask not shown to form a contact hole and, then, a source electrode 19 is formed that comes in ohmic contact with the $n^+$-type source region 14 and the $p^+$-type well contact region 15. The drain electrode 10 is formed on the back surface of the semiconductor substrate to come in ohmic contact with the drain region 12. The source electrode 19 is connected to a source terminal S, the drain electrode 10 is connected to a drain terminal D, and the gate electrode 17 is connected to a gate terminal G.

Next, described below is the operation of the vertical type MOSFET 1 constituted as described above.

First, the flow path of carriers under the on condition will be described with reference to FIG. 2(a). When a voltage in excess of a threshold voltage is applied to the gate electrode 17, an inverted layer is formed in the channel 21 due to the effect of an electric field, and the n⁺-type source region 14 and the n⁻-type recessed region 22 are rendered electrically conductive via the channel 21. Therefore, the electrons flow from the source electrode 19 into the n⁺-type drain region 12 along the electron flow path 31. That is, the electrons flow along the below-mentioned path, i.e., source terminal S → source electrode 19 → n⁺-type source region 14 → channel 21 → n⁻-type recessed region 22 → n⁺-type through hole region 25 → n⁺-type drain region 12 → drain electrode 10.

Here, the electrons that flow from the channel 21 into the n⁻-type recessed region 22 readily disperse throughout the n⁻-type recessed region 22 and flow toward the n⁺-type through hole region 25.

Next, described below with reference to FIG. 2(a) is the voltage distribution under the off condition and the breakdown voltage across the drain and the source. Under the condition where a voltage lower than the threshold voltage is applied to the gate electrode 17, the inverted layer is not formed in the channel 21, and the n⁺-type source region 14 and the n⁻-type recessed region 22 positioned on both sides of the channel 21 are electrically insulated. The n⁺-type through hole region 25 and the n⁺-type drain region 12 are rendered electrically conductive. As a result, the voltage applied across the drain and the source is further mostly applied not only to the n⁻-type drift region 11 sandwiched between the p-type well region 13 and the n⁺-type drain region 12 but also to the n⁻-type recessed region 22 sandwiched between the p-type well region 13 and the n⁺-type through hole region 25, and depletion layers are formed in these regions. Therefore, the breakdown voltage of the vertical type MOSFET 1 is determined by either the pn junction consisting of the n⁻-type drift region 11 and the p-type well region 13 or the pn junction consisting of the n⁻-type recessed region 22 and the p-type well region 13. That is, the breakdown voltage $BV_1$ of the pn junction consisting of the n⁻-type drift region 11 and the p-type well region 13 is basically determined by the impurity concentration $n_1$ and the thickness $d_1$ of this region, and the breakdown voltage $BV_2$ of the pn junction consisting of the n⁻-type recessed region 22 and the p-type well region 13 is determined by the impurity concentration $n_2$ and the thickness $d_2$ of this region. Here, however, the impurity concentration $n_1$ and $n_2$ are equal to each other, i.e., $n_1=n_2$ ($=n$) since these regions consist of the n⁻-type low-impurity-concentration layer of the semiconductor substrate.

In designing the breakdown voltage of the vertical type MOSFET 1, the below-mentioned relationship should be maintained between the above $BV_1$ and $BV_2$ so that the avalanche breakdown will take place only at the pn junction portion consisting of the n⁻-type drift region 11 and the p-type well region 13 but that the avalanche breakdown will not take place at the pn junction portion consisting of the n⁻-type recessed region 22 and the p-type well region 13.

$$BV_1<BV_2 \quad (4).$$

The reason is because if the avalanche breakdown takes place at the pn junction portion consisting of the n⁻-type recessed region 22 and the p-type well region 13, the generated hot carriers deteriorate the interface of silicon and oxide film in the channel region 21 creating such adverse effects as a change in the threshold voltage, decrease in the breakdown voltage of the gate oxide film, breakage of insulation and the like.

Described below is the element structure in the case when the breakdown voltage across the drain and the source is designed to be several tens of volts. For instance, when the breakdown voltages $BV_1$ and $BV_2$ are set to be 60 volts, the impurity concentration n and the thickness $d_1$ or $d_2$ of the n⁻-type drift region 11 and the n⁻-type recessed region 22 are selected to be as follows from the literature, S. M. Sze, "Physics of Semiconductor Devices", John Wiley and Sons Inc., 1969, pp. 115 and 117.

$$n=1\times10^{16} \text{ [cm}^{-3}] \quad (5)$$

$$d_1=d_2=2.5 \text{ [}\mu\text{m]} \quad (6).$$

From the equation 5, the outer size of the through hole cell 2 in the element plane shown in FIG. 1 is given, if one side thereof is denoted by $L_{TH}$, by the following equation, $$L_{TH}=d_2\times2+d_3\times2+d_4 \quad (7)$$

where $d_3$ denotes the thickness of the n⁺-type through hole region 25, and $d_4$ denotes the width of the hole 24.

For instance, if $d_3=0.5$ [μm] and $d_4=1$ [μm], then $L_{TH}=7$ [μm] from the above equations (5), (6) and (7). From the viewpoint of dimensional precision in modern machining technology, it is possible to set $L_{TH}$ to be smaller than 10 μm. Therefore, if the DMOS cells 2 and the through hole cells 3 are alternatingly arranged in the vertical and lateral directions as shown in FIG. 1, the outer size of the DMOS cells can be set to be smaller than 10 μm too, since the outer sizes of these cells are set to be equal in the element plane.

Next, described below is the on-resistance. The on-resistance $R_{DCELL}$ of a DMOS cell 2 in the vertical MOSFET 1, the on-resistance $R_{TCELL}$ of a through hole cell 3, and the product $R_{ONS}$ of element area and on-resistance of the vertical MOSFET 1 are given by the following equations from the consideration of flow path of the carriers, $$R_{DCELL}=R_S+R_{CH} \quad (8)$$

$$R_{TCELL}=R_{REC}+R_{DRA}+R_{TH} \quad (9).$$

where $R_S$ denotes the resistance of the n⁺-type source region 14, $R_{CH}$ denotes the resistance of the channel 21, $R_{REC}$ denotes the resistance of the n⁻-type recessed region 22, $R_{TH}$ denotes the resistance of the n⁺-type through hole region 25, and $R_{DRA}$ denotes the resistance of the n⁺-type drain region 12.

$$R_{ONS}=(R_{DCELL}+R_{TCELL})/N \quad (10)$$

where N is the number of DMOS cells 2 and the through hole cells 3 per unit area.

Since $R_S$, $R_{TH}$ and $R_{DRA}$ are set to be smaller than $R_{CH}$ and $R_{REC}$, the equations (8), (9) and (10) can be simplified as follows.

$$R_{DCELL}\approx R_{CH} \quad (11)$$

$$R_{TCELL}\approx R_{REC} \quad (12)$$

$$R_{ONS}\approx(R_{CH}+R_{REC})/N \quad (13).$$

The equations (1) to (3) that give the on-resistances of the conventional vertical type MOSFET shown in FIGS. 3 and 6 can similarly be simplified as follows:

$$R_{CELL}\approx R_{CH}+R_{JFET}+R_{DRI} \quad (14)$$

$$R_{CELL}\approx R_{CH}+R_{DRI} \quad (15).$$

The resistances $R_{REC}$ and $R_{DRI}$ in the equations (11) to (15) are equal considering the breakdown voltage designing conditions represented by the equations (5) to (7) and their structure, i.e., $$R_{REC} \approx R_{DRI} \qquad (16).$$

Figure 6:
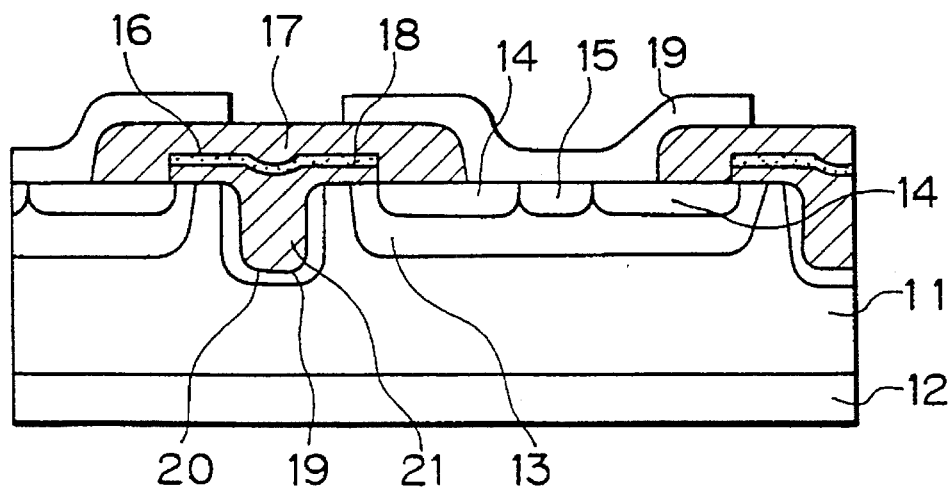
FIG. 6 is a section view of a conventional vertical type MOSFET.

Therefore, there is no difference in on-resistance between the vertical type MOSFET 1 of this embodiment and the vertical type MOSFET that is shown in FIG. 6 based on the on-resistance of one cell only.

Next, described below is the product $R_{ONS}$ which is one of the important characteristics of the vertical type MOSFET when comparing the vertical MOSFET 1 of this embodiment with the conventional vertical type MOSFET shown in FIGS. 3 and 6.

Figure 5:
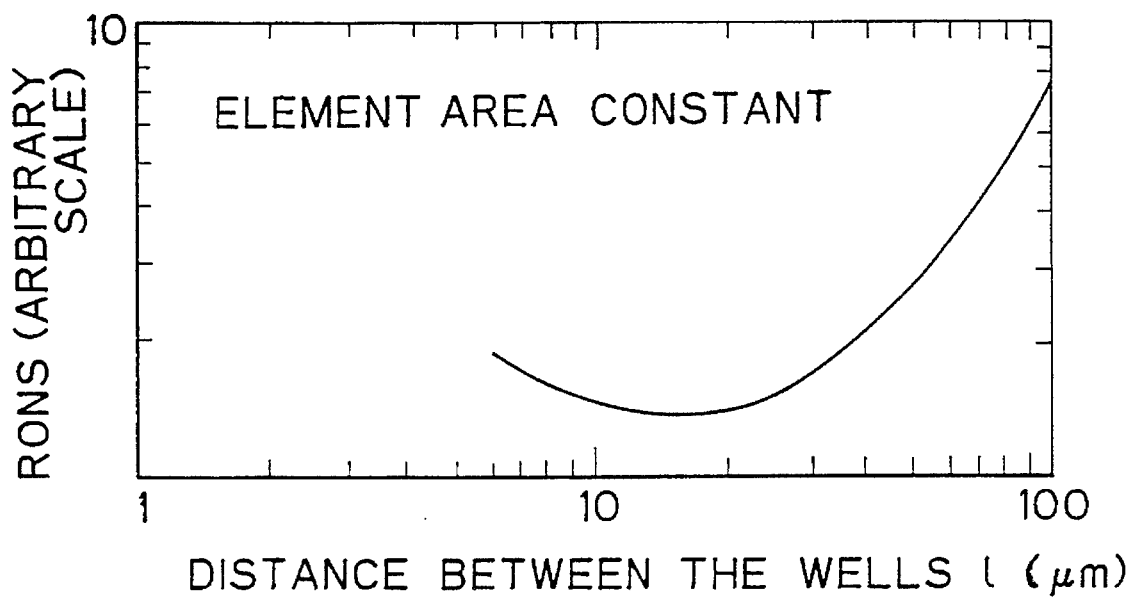
FIG. 5 is a diagram showing a conventional relationship between the wall distance l and the $R_{ONS}$.

What is very important, here is that even if the size of the cell of the conventional structure shown in FIG. 3 is reduced by utilizing modern machining technology as exemplified in FIG. 5, $R_{JFET}$ increases and $R_{ONS}$ becomes the smallest when the size of the cell is ten and several μm. Therefore, a further reduction in the size of the cell has no effect. In the conventional structure shown in FIG. 6, on the other hand, when the element is in an off condition, a high tension applied to the drain electrode is induced near the channel via the drift region 11 and the high-impurity-concentration layer 21 around the groove to easily develop the breakdown. In order to obtain a necessary breakdown voltage, the distance between the groove 20 and the well 13 must be sufficiently great. Accordingly, the size of the cell inclusive of the groove is not reduced and $R_{ONS}$ also does not decrease.

The products $R_{ONS}$ will now be compared between the vertical type MOSFET 1 according to the embodiment shown in FIGS. 1 and 2 and the conventional vertical type MOSFET shown in FIG. 3.

It is now presumed that the DMOS cells and the through hole cells have a side that measures 10 μm in the vertical type MOSFET 1 shown in FIGS. 1 and 2, and the cells have a side that measures 15 μm in the vertical type MOSFET (hereinafter referred to as vertical type MOSFET 0) of FIG. 3. If the number of cells is $N_0$ per unit area of the vertical type MOSFET 0, the number $N_1$ of cells per unit area of the DMOS cells and through hole cells of the vertical type MOSFET 1 can be easily calculated as follows:

$$N_1 = (9/8) \cdot N_0 \qquad (17).$$

Next, considered below is the channel resistance. In general, the channel resistance $R_{CH}$ maintains the following relationship concerning the channel length L and the channel width W.

$$R_{CH} \propto L/W \qquad (18).$$

If the boundary line between the channel 16 and the drift region 11 is formed 2 μm inside the outer peripheral line, then the channel width $W_0$ of the cell of vertical type MOSFET 0 is $(15-2\times2)\times4=44$ [(μm]. On the other hand, the channel width $W_1$ of the DMOS cell of the vertical type MOSFET 1 is $10\times4=40$ [μm] since the boundary line between the channel 21 and the recessed region 22 is in agreement with the outer peripheral line of the cell, i.e., $$\left. \begin{array}{l} W_0 = 44 \; [\mu m] \\ W_1 = 40 \; [\mu m] \end{array} \right\} \qquad (19)$$

If the cells of the vertical type MOSFET 0 and the DMOS cells of the vertical type MOSFET 1 have channel resistances that are $R_{CH0}$ and $R_{CH1}$, and if they have an equal channel length L, then there exists the following relationship from the equations (18) and (19), $$R_{CH1} = 1.1 \times R_{CH0} \qquad (20).$$

Next, $R_{ONS}$ of the vertical type MOSFET 0 is denoted by $R_{ONS0}$ and $R_{ONS}$ of the vertical type MOSFET 1 is denoted by $R_{ONS1}$, and are compared with each other. $R_{ONS0}$ is given as follows from the equations (2) and (14), and $R_{ONS1}$ is given as follows from the equations (11) to (13), $$R_{ONS0} \approx (R_{CH0} + R_{JFET} + R_{DRI})/N_0 \qquad (21)$$

$$R_{ONS1} \approx (R_{CH1} + R_{REC})/N_1 \qquad (22).$$

The equations (16), (17) and (20) are substituted for the equations (21) and (22) to eliminate $R_{CH1}$, $R_{REC}$ and $N_1$, and to find $R_{ONS0}/R_{ONS1}$.

$$\frac{R_{ONS0}}{R_{ONS1}} \approx \frac{9}{8} \cdot \left[ 1 + \frac{R_{JFET} - 0.1 \times R_{CH0}}{1.1 \times R_{CH0} + R_{DRI}} \right] \qquad (23)$$

As will be obvious from the equation (23), $R_{ONS0}/R_{ONS1} > 1$ from which it is proved that the product $R_{ONS}$ of the element area and the on-resistance of the vertical type MOSFET 1 of this embodiment is smaller than that of the conventional vertical type MOSFET 0 that is shown in FIG. 3.

At a corner portion of the DMOS cell having a square shape as shown in FIG. 1, furthermore, the p-type well region 13 and the n⁺-type source region 14 are formed by double diffusion, which is positioned in a self-aligned manner by the gate electrode 17, and whereby the channel length becomes shorter than the sides of the cells, the impurity concentration decreases and the threshold voltage decreases. Therefore, even if the cell is designed to be turned on at a gate voltage $V_G$ of 1.5 volts, the cell may be turned on at the corner portion at, for example, 1.2 volts or may be broken down at the corner portion by the surge voltage when the device is turned off. These problems, however, can be overcome by employing the structure of this embodiment.

That is, by alternatingly arranging the DMOS cells in the vertical and lateral directions as shown in the B—B' section view f FIG. 2(b), the distance can be decreased between the neighboring DMOS cells 2 at the corner portion, and the DMOS cell 2 is prevented from being turned on at the corner portion since the JFET resistance increases in the $n^{31}$-type drift region 11 that is sandwiched by the p-type well regions 13 of the neighboring cells 2. Under the turned-off condition, the depletion layers 50 extending from the two DMOS cells 2 become continuous and the electric field becomes mild at the JFET portion. This helps eliminate the breakage that results from the surge voltage applied to the drain that is concentrated at the corner portion. At the other sides of the cells, the through hole cell 3 exists because of the pattern in which they are alternatingly arranged in the vertical and lateral directions, and the effect of the depletion layer 50 becomes negligibly small.

According to the above-mentioned embodiment shown in FIGS. 1 and 2, the n⁺-type through hole region 25 is formed as the structure for decreasing the electric resistance in the lengthwise direction near the hole 23. It is, however, allowable to employ other structures. For instance, the effect of the present invention can be obtained and $R_{ONS}$ can be decreased even when the insulating material 24 filled inside the hole 23 is changed into a conductor having a small resistance such as a metal, and the side surface of the hole 23 is brought into ohmic contact with the conductor. Moreover, though this embodiment deals only with a structure that includes the recessed structure, the product $R_{ONS}$ can be decreased smaller than that of the conventional vertical type MOSFET even with a planar structure that does not have the recessed structure owing to the effect of the through hole cell 3.

Figure 7:
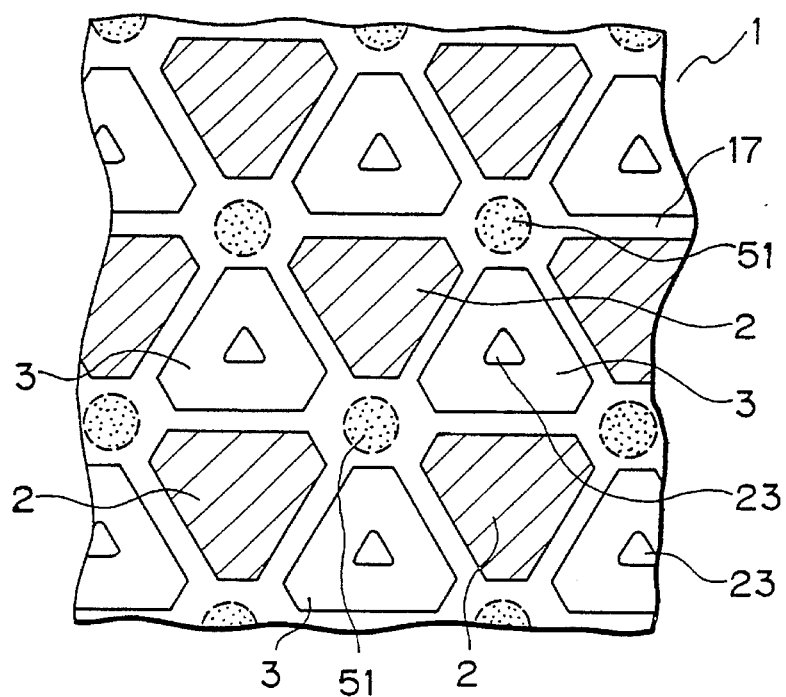
FIG. 7 is a schematic diagram of a plane pattern illustrating the arrangement of DMOS cells and through hole cells of the present invention adapted to another cell form.
Figure 8:
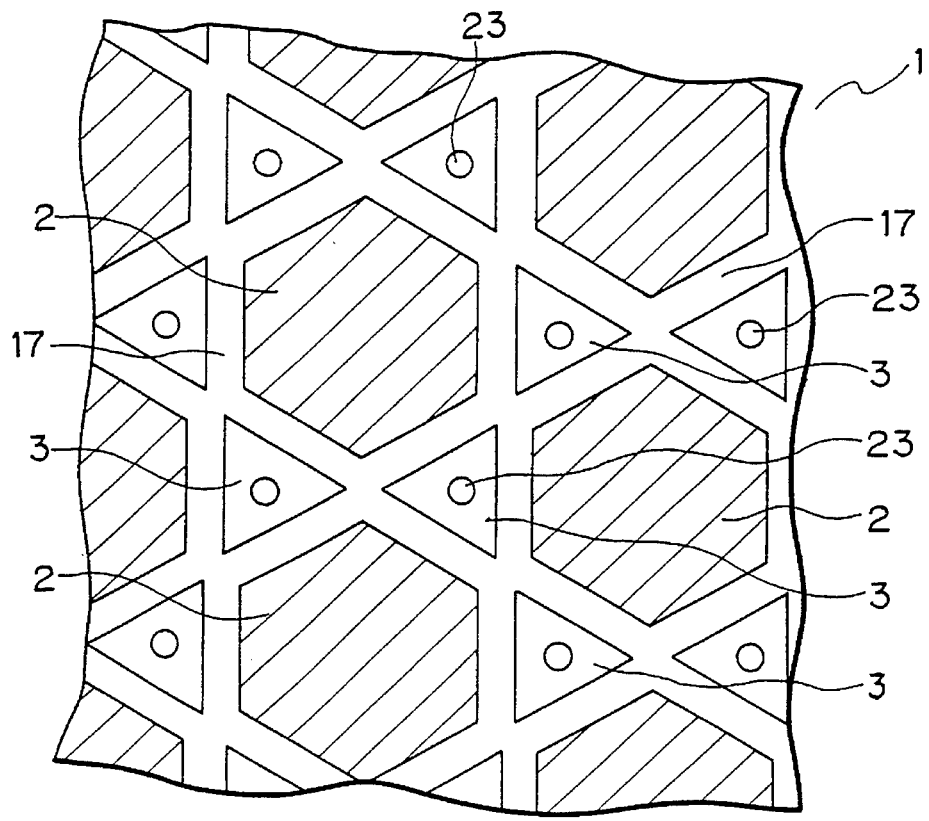
FIG. 8 is a schematic diagram of a plane pattern illustrating the arrangement of DMOS cells and through hole cells of the present, invention adapted to a further cell form.

In the above embodiment, furthermore, the invention was adapted to lattice-like cells having a plane of a square shape. It should, however, be noted that the present invention can be suitably adapted to any other polygonal cells or striped cells. In these cases, the DMOS cells 2 and the through hole cells 3 are arranged as follows; i.e., the through hole cells 3 are neighboring each other at the sides that serve as channels of the DMOS cells 2. Moreover, the through hole cells 3 need not be arranged for all sides of the DMOS cells 2, but may be determined depending upon the preset number per unit area of the DMOS cells 2 and the required decrease in the on-resistance. FIGS. 7 and 8 illustrate examples of this application.

FIG. 7 is a schematic diagram of a plane pattern that illustrates the arrangement of DMOS cells 2 and through hole cells 3 when the present invention is adapted to hexagonal cells having nearly a triangular shape. In FIG. 7, a p-type layer 51 (in the case of the n-channel type) is formed under the gate electrode 17 between the corners of the DMOS cells 2 in a triangular shape to make the depletion layers communicate with each other under the off condition in view of a drop in the threshold voltage at the corners. Here, the p-type layer 51 may be continuous to the p-type well region 13, or may be eliminated by bringing the DMOS cells 2 closer to each other.

FIG. 8 illustrates an example in which the DMOS cells 2 of orthohexagonal shape and the through hole cells 3 of equilateral triangular shape are arranged. In this case, all sides of the DMOS cells 2 can face the through hole cells 3 and an increased number of DMOS cells can be laid per unit area eventually making it possible to increase the peripheral length of the effective channels and to decrease the on-resistance.

According to the vertical type semiconductor device of the present invention, there is imposed no particular limitation on the shape of the current control cell regions that include a gate electrode, and the current control cell regions are arranged around, for example, the cell region and the region where the hole is formed, i.e., arranged around the low-resistance cell region and are hence formed depending upon the shapes of these regions. Therefore, if the cell region has a polygonal shape, such as a hexagonal shape, the current control cell region is formed in a shape that meets the outer peripheral shape thereof.

At the same time, the current control cell region is formed in a shape that varies depending upon the peripheral shape of the region where the hole is formed.

That is, it is desired that the current control cell region has a polygonal cellular shape that enables the channel region to be formed along the sides thereof and the low-resistance cell regions are arranged to face all sides of the current control cell region.

It is further desired that both the current control cell regions and the low-resistance cell regions have a square cellular shape and are alternatingly arranged in the vertical and lateral directions on the semiconductor layer.

As another example, it is desired that the current control cell regions have an orthohexagonal cellular shape and the low-resistance cell regions have an equilateral triangular shape.

It is further desired that the current control cell regions that are neighboring each other at the corners of the polygonal cellular shape thereof maintain a distance among themselves such that the depletion layers thereof overlap each other under the turned-off condition of the device.

In the semiconductor device of the present invention, it is desired that the surfaces of the low-resistance cell regions are higher than the surfaces of the current control cell regions.

Though the aforementioned embodiments have dealt with those of the n-channel type, the invention can be adapted to those of the p-channel type as a matter of course. Furthermore, the insulated gate structure is not necessarily limited to the MOS type, but, for instance, a nitride film may be formed as the gate insulating film as a matter of course.

According to the present invention, the on-resistance of the vertical type semiconductor device can be strikingly decreased without impairing the breakdown voltage of the element.

We claim:

1. A vertical type semiconductor device comprising:

a semiconductor substrate of a first type conductivity which includes:

a drain region formed from a layer of high impurity concentration, and a semiconductor layer of low impurity concentration formed over said drain region;

a first well region of a second type conductivity formed in a portion of said semiconductor layer, said semiconductor layer constituting a drift region at a portion located between said first well region and said drain region;

a source region of said first type conductivity formed in a portion of a surface of said first well region;

an insulated gate electrode formed on a periphery of said first well region so as to form a channel region along said periphery of said first well region; and said semiconductor layer forming a hole extending within and downwardly from a top surface of said semiconductor layer to said drain region, said hole being formed between said first well region and a neighboring second well region of said second type conductivity and formed within said semiconductor layer, said neighboring second well region being formed so as to not contact said first well region;

whereby electrical current flows between said source region and said drain region in response to a voltage signal applied to said insulated gate electrode; and whereby a first on-resistance in a lengthwise direction of said hole is smaller than a second on-resistance of said drift region;

wherein said top surface of said semiconductor layer disposed between said first well region and said neighboring second well region projects upwards in said lengthwise direction of said hole so that said top surface of said semiconductor layer is disposed farther from said drain region than is said periphery of said first well region where said channel region is formed.

2. A vertical type semiconductor device according to claim 1, wherein:

said hole is formed at a center point between said first well region and said neighboring second well region within said semiconductor layer;

said device further comprising a plurality of well regions including said first well region and said neighboring second well region, said plurality of well regions being arranged substantially in a matrix form having therebetween alternatively arranged neighboring ones of a plurality of holes extending within and downwardly from respective top surfaces of said semiconductor layer to said drain region;

whereby diagonally adjoining ones of said plurality of well regions respecting said matrix form in a direction not separated by respective ones of said plurality of holes are closer in distance than vertically adjoining and laterally adjoining ones of said plurality of well regions.

3. A vertical type semiconductor device according to claim 1, wherein a through hole diffusion region of said first conductivity type is formed in an interior surface of said semiconductor layer forming said hole.

4. A vertical type semiconductor device according to claim 2, wherein a through hole diffusion region of said first conductivity type is formed in an interior surface of said semiconductor layer forming said hole.

5. A vertical type semiconductor device according to claim 1, wherein an interior surface of said semiconductor layer forming said hole is charged with a material of high conductivity making an ohmic contact with said semiconductor layer.

6. A vertical type semiconductor device comprising:

a drain region of a first conductivity type;

a semiconductor layer of said first conductivity type formed on a main surface of said drain region, said semiconductor layer having an impurity concentration lower than an impurity concentration of said drain region, and said semiconductor layer forming a drift region;

a current control cell region for controlling a current between a source region and said drain region, said current control cell region including:

a well region of a second conductivity type formed in a portion of said semiconductor layer and forming a first PN junction therewith, said first PN junction extending up to and terminating at a first reference point at a first uppermost surface level of said semiconductor layer, said source region being of said first conductivity type, said source region being formed within said well region and forming a second PN junction therewith, said second PN junction extending up to and terminating at a second reference point at said first uppermost surface level of said semiconductor layer, and an insulated gate structure formed over a first channel region in said well region between said first reference point and said second reference point; and a low-resistance cell region of said first conductivity type and having an impurity concentration greater than an impurity concentration of said semiconductor layer, said low-resistance cell region being formed in a portion of said semiconductor layer different from a portion of said semiconductor layer in which said well region is formed, said low-resistance cell region defining a second channel region related to said first channel region below said insulated gate structure, said low-resistance cell region extending from a second uppermost surface level of said semiconductor layer down through to said drain region, said second uppermost surface layer being farther from said drain region than said first uppermost surface layer.

7. A vertical type semiconductor device according to claim 6, further comprising a plurality of said current control cell regions each having a polygonal cellular shape such that respective ones of said second channel regions are formed along sides of said plurality of said current control cell regions.

8. A vertical type semiconductor device according to claim 7, further comprising a plurality of said low-resistance cell regions each arranged so as to respectively oppose all sides of corresponding ones of said plurality of polygonal cellular shaped current control cell regions.

9. A vertical type semiconductor device according to claim 8, wherein said plurality of current control cell regions and said plurality of low-resistance cell regions each have a square cellular shape and are arranged alternately in lateral directions on said semiconductor layer.

10. A vertical type semiconductor device according to claim 8, wherein:

said plurality of current control cell regions each have an orthohexagonal cellular shape; and said plurality of low-resistance cell regions each have an equilateral triangular cellular shape.

11. A vertical type semiconductor device according to claim 8, wherein neighboring ones of said plurality of current control cell regions at corners of said polygonal cellular shape thereof maintain such a distance among themselves that respective depletion layers overlap each other when said device is turned off.

12. A vertical type semiconductor device according to claim 6, wherein said low-resistance cell region is formed by a diffusion from an interior surface of a hole formed by said semiconductor layer and extending toward said drain region.

13. A vertical type semiconductor device comprising:

a first semiconductor layer of a first conductivity type defining a drain region;

a second semiconductor layer of said first conductivity type formed over a surface of said first semiconductor layer and having an impurity concentration lower than an impurity concentration of said drain region, said second semiconductor layer defining a plurality of drift regions;

a plurality of well regions of a second conductivity type formed within said second semiconductor layer and extending from a surface of said second semiconductor layer;

a plurality of source regions of said first conductivity type formed within respective ones of said plurality of well regions and extending from respective surfaces of said plurality of well regions;

a plurality of gate electrodes each provided adjacent a respective junction portion between a corresponding one of said plurality of well regions and a corresponding one of said plurality of source regions to each form one of a respective plurality of channel regions at each of said respective junction portions; and said second semiconductor layer forming at least one hole portion in a region of said second semiconductor layer other than a plurality of respective regions where said plurality of well regions are formed, said at least one hole portion extending from an uppermost surface of said second semiconductor layer down through to said first semiconductor layer, said uppermost surface of said second semiconductor layer being disposed between first and second ones of said plurality of well regions, and said uppermost surface of said second semiconductor layer being disposed farther from said drain region than said respective surfaces of said plurality of well regions.

14. A vertical type semiconductor device according to claim 13, wherein an interior portion of said second semiconductor layer where said second semiconductor layer forms said at least one hole portion has a resistance that is smaller than a resistance of a respective one of said plurality of drift regions defined by said second semiconductor layer.

15. A vertical type semiconductor device according to claim 13, wherein said hole portion is charged with a material of high conductivity.

16. A vertical type semiconductor device according to claim 1, further comprising a plurality of low-resistance cell regions formed in a portion of said semiconductor layer different from a portion of said semiconductor layer where said first well region is formed.

17. A vertical type semiconductor device according to claim 16, wherein said first well region and said plurality of low-resistance cell regions each have a square cellular shape and are arranged alternately in lateral directions on said semiconductor layer.

18. A vertical type semiconductor device comprising:
a first semiconductor layer of a first conductivity type defining a drain region;
a second semiconductor layer of said first conductivity type formed over a surface of said first semiconductor layer and having an impurity concentration lower than an impurity concentration of said drain region, said second semiconductor layer defining a plurality of drift regions;
a plurality of well regions of a second conductivity type formed within said second semiconductor layer and extending from a second uppermost surface of said second semiconductor layer;
a plurality of source regions of said first conductivity type formed within respective ones of said plurality of well regions and extending from respective surfaces of said plurality of well regions;
a plurality of gate electrodes each provided adjacent a respective junction portion between a corresponding one of said plurality of well regions and a corresponding one of said plurality of source regions to each form one of a respective plurality of channel regions at each of said respective junction portions; and
said second semiconductor layer forming at least one hole portion in a region of said second semiconductor layer other than a plurality of respective regions where said plurality of well regions are formed, said at least one hole portion extending from a first uppermost surface of said second semiconductor layer down through to said first semiconductor layer, said first uppermost surface of said second semiconductor layer being disposed farther from said first semiconductor layer than said second uppermost surface of said second semiconductor layer.

19. A vertical type semiconductor device according to claim 18, wherein an interior portion of said second semiconductor layer where said second semiconductor layer forms said at least one hole portion has a resistance that is smaller than a resistance of a respective one of said plurality of drift regions defined by said second semiconductor layer.

20. A vertical type semiconductor device according to claim 18, wherein an interior portion of said second semiconductor layer forming said at least one hole portion is charged with a material of high conductivity.

21. A vertical type semiconductor device according to claim 1, wherein a first cross-sectional area of said drift region in a direction of said electrical current flow is larger in a first region of said semiconductor layer remote from said channel region than a second cross-sectional area of said drift region in said direction of said electrical current flow in a region of said semiconductor layer adjacent to said channel region.

22. A vertical type semiconductor device according to claim 21, further comprising an electrical current bypassing passage made of at least one of a conductive material and a semiconductive material disposed in contact with said drift region so that at least a portion of said electrical current flowing through said channel region flows through said electrical current bypassing passage to said drain region.

23. A vertical type semiconductor device according to claim 22, wherein said electrical current bypassing passage is formed at a position farther from said drain region than said channel region.

24. A vertical type semiconductor device according to claim 23, wherein said electrical current bypassing passage is formed in said drift region.

25. A vertical type semiconductor device according to claim 1, further comprising an electrical current path farther in a vertical direction from said drain region than said channel region.

* * * * *